(12) United States Patent
Chen (10) Patent No.: US 9,852,941 B2
(45) Date of Patent: Dec. 26, 2017

(54) STACKED CONDUCTOR STRUCTURE AND METHODS FOR MANUFACTURE OF SAME

(71) Applicant: Analog Devices, Inc., Norwood, MA (US)

(72) Inventor: Baoxing Chen, Westford, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/506,330

(22) Filed: Oct. 3, 2014

(65) Prior Publication Data

US 2016/0099208 A1 Apr. 7, 2016

(51) Int. Cl.
| | |
|---|---|
| *H01L 23/528* | (2006.01) |
| *H01L 23/552* | (2006.01) |
| *H01L 49/02* | (2006.01) |
| *H01L 21/56* | (2006.01) |
| *H01L 21/768* | (2006.01) |
| *H01L 21/285* | (2006.01) |
| *H01L 21/311* | (2006.01) |
| *H01L 21/3213* | (2006.01) |
| *H01L 23/48* | (2006.01) |
| *H01L 23/50* | (2006.01) |
| *H01L 23/522* | (2006.01) |
| *H01L 23/532* | (2006.01) |

(52) U.S. Cl.
CPC .. *H01L 21/76831* (2013.01); *H01L 21/76805* (2013.01); *H01L 23/522* (2013.01); *H01L 23/5225* (2013.01); *H01L 23/5286* (2013.01); *H01L 23/53214* (2013.01); *H01L 23/53242* (2013.01); *H01L 23/552* (2013.01); *H01L 28/86* (2013.01); *H01L 21/32134* (2013.01); *H01L 23/5226* (2013.01); *H01L 23/53295* (2013.01); *H01L 2224/48091* (2013.01)

(58) Field of Classification Search
CPC ............ H01G 4/30; H01G 4/06; H01G 4/242
See application file for complete search history.

(56) References Cited

U.S. PATENT DOCUMENTS

| | | | |
|---|---|---|---|
| 4,071,878 A | * | 1/1978 | Stynes .......................... 361/307 |
| 4,349,862 A | | 9/1982 | Bajorek et al. |
| 4,949,217 A | | 8/1990 | Ngo |
| 5,055,966 A | | 10/1991 | Smith et al. |
| 5,272,590 A | | 12/1993 | Hernandez |
| 5,436,186 A | | 7/1995 | Hsue et al. |
| 5,822,174 A | | 10/1998 | Yamate et al. |
| 6,477,032 B2 | | 11/2002 | Makl, Jr. |

(Continued)

*Primary Examiner* — Su C Kim
*Assistant Examiner* — David S Wilbert
(74) *Attorney, Agent, or Firm* — Wolf, Greenfield & Sacks, P.C.

(57) ABSTRACT

A circuit structure that includes a plurality of stacked conductor layers separated from each other by respective dielectric layers. The conductor layers may include a first set of conductor layers made of a first type conductor material and a second set of conductor layers made of a second type conductor material different from the first. A pair of conductor posts may traverse the stacked conductor layers. A first post may be electrically connected to the first set of conductor layers and electrically insulated from the second set of conductor layers. A second post electrically connected to the second set of conductor layers and electrically insulated from the first set of conductor layers.

20 Claims, 7 Drawing Sheets

(56) References Cited

U.S. PATENT DOCUMENTS

| | | |
|---|---|---|
| 6,765,781 B2 | 7/2004 | Togashi |
| 6,965,507 B2 | 11/2005 | Togashi et al. |
| 7,499,258 B2 | 3/2009 | Shim et al. |
| 7,644,480 B2 | 1/2010 | Kim et al. |
| 8,289,675 B2 | 10/2012 | Devoe et al. |
| 8,713,769 B2 | 5/2014 | Dudnikov |
| 2004/0070950 A1* | 4/2004 | Higashitani et al. ......... 361/728 |
| 2004/0100518 A1* | 5/2004 | Silverbrook .................... 347/20 |
| 2007/0296520 A1* | 12/2007 | Hosokawa et al. ........... 333/132 |
| 2008/0216298 A1 | 9/2008 | Dudnikov |
| 2008/0217049 A1* | 9/2008 | Dudnikov ..................... 174/260 |
| 2009/0296310 A1 | 12/2009 | Chikara |
| 2012/0079717 A1 | 4/2012 | Chikara |
| 2012/0081832 A1 | 4/2012 | Chikara |

\* cited by examiner

STACKED CONDUCTOR STRUCTURE AND METHODS FOR MANUFACTURE OF SAME

BACKGROUND

The present disclosure relates to a stacked conductor structure such as those that may be used for multi-layer capacitors, power and/or ground plane distribution or electro-magnetic shielding structures.

Modern integrated circuit manufacturing techniques vary in complexity and cost. Typical fabrication techniques for integrated circuit systems, for example, require conductors that interconnect circuit elements to be manufactured according to photolithography techniques involving a complicated series of masks and etchants. After a photoresist material is deposited on a given substrate, a mask is overlaid upon the photoresist. Portions of the material will be exposed to incident radiation and others will not, depending on patterns imposed by the mask. A series of chemical treatments may be applied to the photoresist, which will engrave the mask pattern onto the material.

The process of applying photoresist, radiation exposure and chemical treatment may be repeated multiple times during fabrication of an integrated circuit. The cost of fabrication typically increases with its complexity. Moreover, individual photolithography techniques typically develop two-dimensional structures; if a three-dimensional structure is required (for example, to route one conductor from the bottom of a multi-layer structure to the top), the cost and complexity of fabrication increases because the masks of circuit structures in one layer must be precisely registered with the mask of circuit structures in adjacent layers to build electrical structures that cross between layers. In modern CMOS fabrication techniques, it can be common for a single semiconductor wafer to undergo 20 photolithography cycles or more.

Construction of interconnections for multiple conductor layers in a typical CMOS process usually is done in a sequential basis. For example, to make a connection through four metal layers in a CMOS circuit, multiple via processes would be needed: A first via would be constructed to extend from the first metal layer to the second metal layer. A second via would be constructed to extend from the second metal layer to the third metal layer. A third via would be constructed to extend from the third metal layer to the fourth metal layer. Manufacture of selective interconnect among overlapping metal layers would be even more difficult, as an interconnect that connects the first metal layer only to the fourth metal layer would have to avoid electrical contact with intervening second and third metal layers. Thus, a via that connects layers one and four would have to be insulated from making contact with layers two and three. Such complexities increase the cost of manufacture for such electrical distribution structures in integrated circuits.

Other manufacturing techniques have been proposed to develop structures that traverse vertically across a structure having multiple horizontal layers. It is possible, for example, to drill vias into a multi-layer stack using a mechanical drill and to fill the resultant hole with a conductor material. Such techniques, however, can be error prone and can lead to inadvertent damage of a semiconductor wafer. Moreover, such techniques require the use of expensive machinery—a first machine to fabricate the multi-layer structure that is desired and a second machine to drill the via. Thus, such techniques involve relatively large capital investment.

The inventor perceives a need for development of vertical components in a multi-layer structure with reduced expense.

The inventor also perceives a need to provide manufacturing techniques that provide simple, cost-effective connections selectively to metal layers that have substantial overlap regions.

DETAILED DESCRIPTION

Embodiments provide a circuit structure that includes a plurality of stacked conductor layers separated from each other by respective dielectric layers. The conductor layers may include a first set of conductor layers made of a first type conductor material and a second set of conductor layers made of a second type conductor material different from the first. A pair of conductor posts may traverse the stacked conductor layers. A first post may be electrically connected to the first set of conductor layers and electrically insulated from the second set of conductor layers. A second post may be connected electrically to the second set of conductor layers and electrically insulated from the first set of conductor layers.

Using different material types for the first set of conductor layers and the second set of conductor layers permits use of selective etchants during manufacture. Conductor posts may be formed in holes that are developed within the stacked structure by a pair of etchants. A first etchant erodes the first conductor material faster than the second conductor material and a second etchant erodes the second conductor material faster than the first conductor material. By using unbalanced etchants to form holes for the conductor posts, manufacturing costs that otherwise might be incurred to build conductor posts as each stacked layer is constructed can be avoided.

Figure 1:
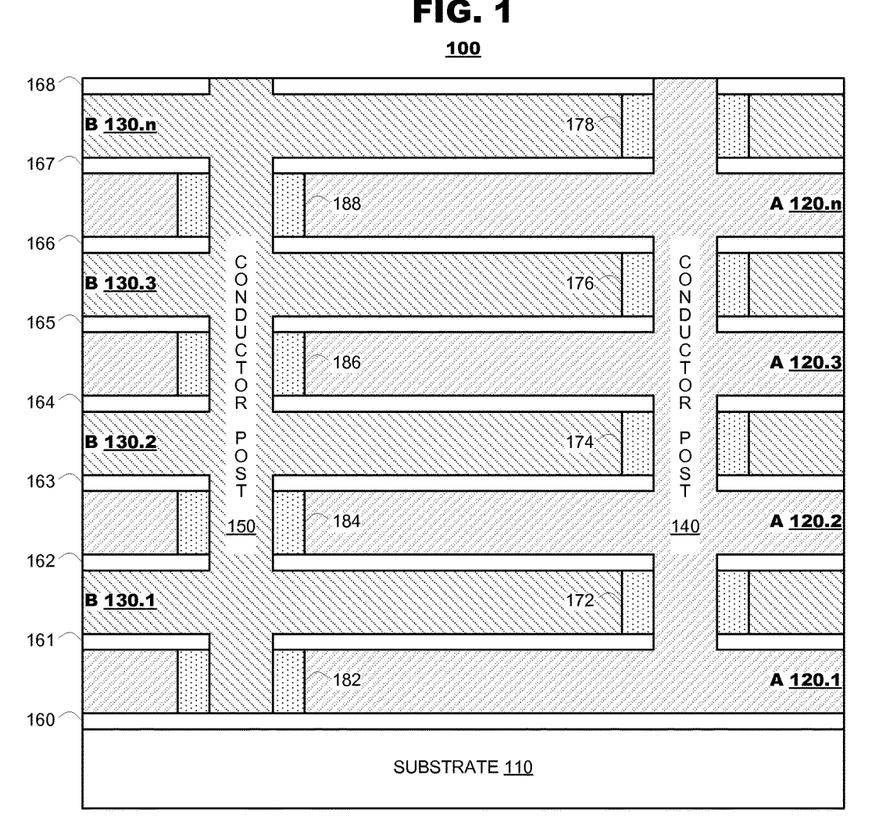
FIG. 1 is a sectional view of a stacked conductor structure according to an embodiment of the present invention.

FIG. 1 is a sectional view of a stacked conductor structure 100 according to an embodiment of the present invention. The structure 100 may include a substrate 110, a first set of conductor layers 120.1-120.N (called "A layers," for convenience) and a second set of conductor layers 130.1-130.N ("B layers"). The structure 100 also may include a plurality of conductor posts 140, 150 that traverse through the stacked structure 100 to contact selected layers 120.1-120.N, 130.1-130.N within the structure 100. The structure 100 may include dielectric structures 160-168, 172-178 and 182-188 to electrically insulate the layers from each other and from the posts 140, 150 as discussed herein.

The A layers 120.1-120.N may be made of a material (typically, a metal) that is different from the material of the B layers 130.1-130.N. As discussed herein, doing so may reduce manufacturing costs when the structure 100 is manufactured according to integrated circuit manufacturing techniques.

In the example of FIG. 1, the A layers and the B layers alternate in one-to-one fashion across the stacked structure 100 and, therefore, there are an equal number of A layers as there are B layers. The first conductor post 140 is shown in electrical contact with all of the A layers 120.1-120.N and the second conductor post 150 is shown in electrical contact with all of the B layers 130.1-130.N. The first conductor post 140 is electrically isolated from the B layers 130.1-130.N by respective dielectric structures 172-178. Although not shown in the sectional view of FIG. 1, the dielectric structures 172-178 may be disposed over peripheral portions of the first conductive post 140 that are co-planar with the B layer conductors 130.1-130.N to maintain electrical isolation between the B layers and the first conductive post 140.

Similarly, the second conductor post 150 may be electrically isolated from the A layers 120.1-120.N by respective dielectric structures 182-188. And, again, although not shown in the sectional view of FIG. 1, the dielectric structures 182-188 may be disposed over peripheral portions of the second conductive post 150 that are co-planar with the A layer conductors 120.1-120.N to maintain electrical isolation between the A layers and the second conductive post 150.

The conductor posts 140, 150 may but need not be made of the same kind of material that the conductive layers to which they are connected are made. That is, conductor post 140 may but need not be made of the same material as the A layers 120.1-120.N. Similarly, the conductor post 150 may but need not be made of the same material as the B layers 130.1-130.N. If desired, the conductor posts 140, 150 may be made of the same material as each other.

The stacked structure 100 illustrated in FIG. 1 may find application in larger circuit systems as a capacitive storage element. In such an embodiment, the A layers and the B layers may be provided in alternating fashion and disposed spatially to maximize overlap between the surface areas of each layer.

In a further embodiment, the stacked structure 100 may be provided as a component in an electrical distribution system. For example, the A layer conductors 120.1-120.N may be provided as power planes for provision of a supply voltage (e.g., VDD) to components of an integrated circuit and the B layer conductors 130.1-130.N may be provided for provision of ground planes for provision of a ground voltage to those components. In such an embodiment, the A layers and the B layers need not be provided in alternating fashion and need not be provided to overlap each other spatially.

In other embodiments, the stacked structure 100 may be provided as a shielding element such as a Faraday shield and may define a cavity therein for provision of other circuit components (e.g. active integrated circuits); in such an embodiment, the A layers and the B layers need not be provided in alternating fashion but may be provided to overlap each other substantially.

Figure 2:
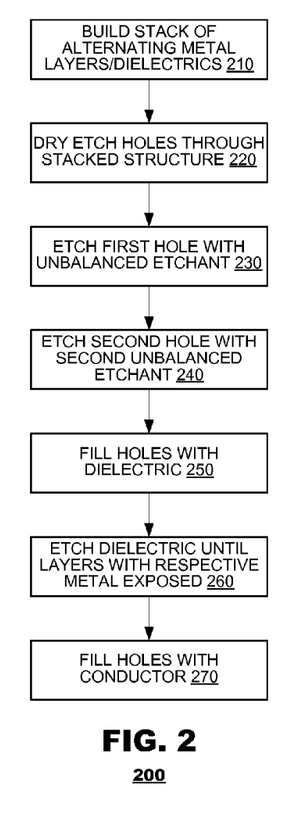
FIG. 2 illustrates a method of manufacturing a stacked structure according to an embodiment of the present invention.

FIG. 2 illustrates a method of manufacturing a stacked structure according to an embodiment of the present invention. The method 200 may begin by building a stack of alternating metal layers separated by dielectrics (box 210). Essentially, the method 200 may build the entire set of A and B layers that will be used in the structure prior to developing the post conductors. The method 200 may form a pair of holes through the stacked structure to expose material of the A and B layers (box 220). The holes may be formed, for example, by a dry etch process or alternatively by drilling vias through the stacked structure.

After the stack is constructed, the method 200 may etch a first hole through the stacked structure using a first unbalanced etchant (box 230). The first unbalanced etchant may erode material from one type of metal layer (say, the A layers) faster than it erodes material from the second type of metal layer (the B layers). Thereafter, the method 200 may etch a second hole through the stacked structure using a second unbalanced etchant (box 240). The second unbalanced etchant may erode material from the second metal layers (the B layers) faster than it erodes material from the first metal layers (the A layers). The method may fill both holes with a dielectric material (box 250) then etch the dielectric material away from the holes to expose a respective set of metal layers (box 260). Once the dielectric etching operation is complete, the metal of the A layers would be exposed in one hole and the metal of the B layers would be exposed in the other hole. Thereafter, the method 200 may fill both holes with a conductor material to form the post conductors (box 270).

Operation of the method 200 of FIG. 2 is expected to achieve a low cost method of manufacturing a stacked conductor structure such as in FIG. 1. Manufacture of the stacked A and B layers should be inexpensive because a single wafer fabrication machine may be used to build repetitive sets of an A layer, a dielectric, a B layer and another dielectric. Moreover, the process steps involved to manufacturing the conductive posts should require two sets of masks to etch a hole for a conductive post, fill the hole with a dielectric, etch away the dielectric to expose metal layers that should be connected to the conductive post, then fill the hole with conductive material to connect to the exposed metal layers even though several sets of A layers, B layers and dielectric layers are present. Such cost savings likely would not occur through use of alternative manufacturing processes that, for example, build portions of the conductive posts incrementally as the A and B layers are built up on top of each other.

In one embodiment, A layers 120.1-120.N of a stacked conductor structure may be fabricated of aluminum (Al) and B layers 130.1-130.N may be fabricated of gold (Au). A first etchant may be a diluted mixture of $H_3PO_4/HNO_3$, which would erode aluminum at a higher rate than gold. A second etchant may be an aqueous iodide iodine solution with phosphate inhibitors, which would erode gold at a higher rate than the aluminum. Polyimide may be used as a dielectric material, both between A and B layers and around conductor posts.

Figure 3:
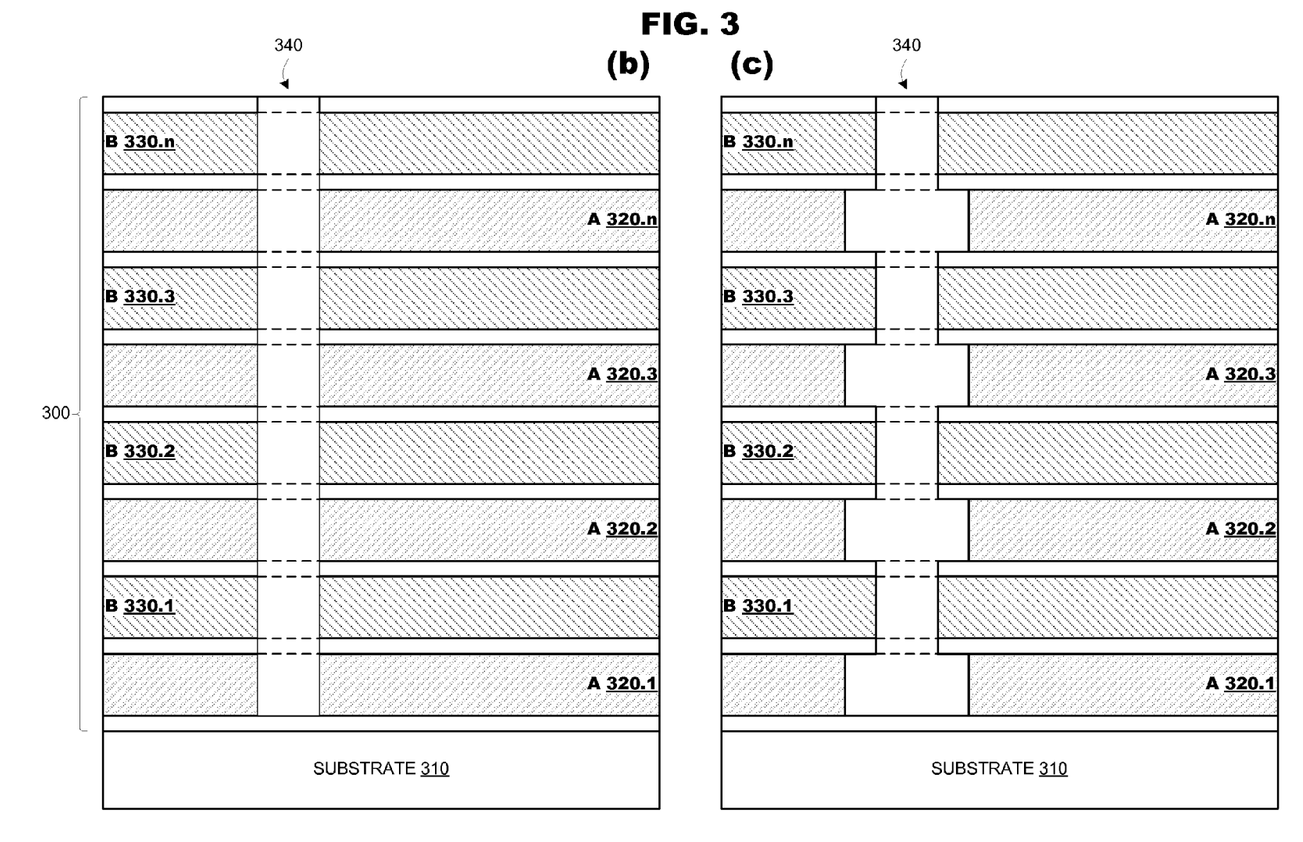
FIG. 3 illustrates exemplary operation of the manufacturing methods presented in FIG. 2.
Figure 3A:
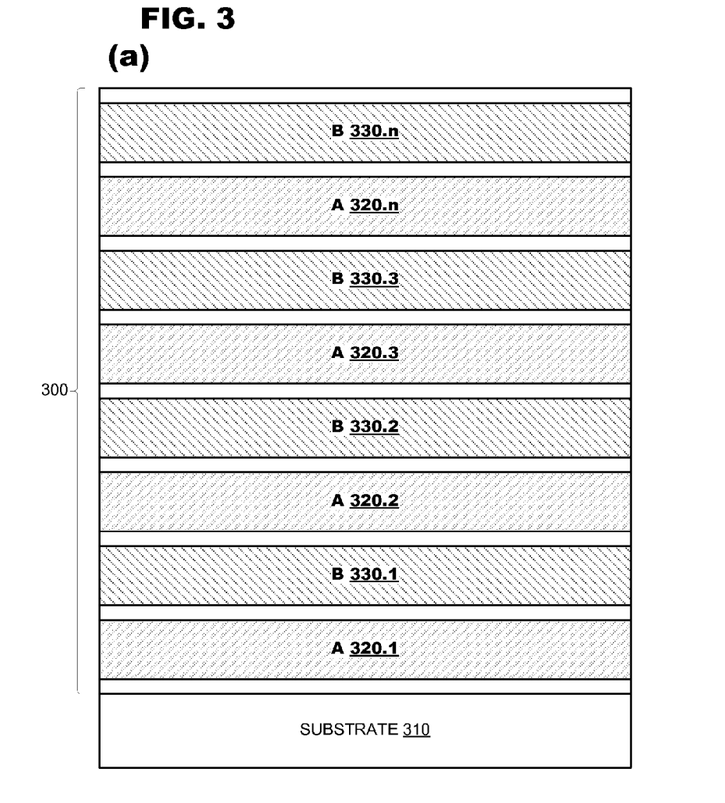

FIG. 3 illustrates exemplary operation of the manufacturing methods presented in FIG. 2. In FIG. 3(a), the stacked structure 300 is built up on top of a substrate material 310 with alternating A layers 320.1, 320.2, . . . , 320.n and B layers 330.1, 330.2, . . . , 330.n built on top of each other and separated by dielectric layers.

FIG. 3(b) schematically illustrates a hole 340 that may be created in the stacked structure 300. The hole may extend through the entire stacked structure, exposing metal of each of the A layers 320.1, 320.2, . . . , 320.n and B layers 330.1, 330.2, . . . , 330.n. Although not shown in FIG. 3(b), a second hole may be formed in the stacked structure 300 for a second conductive post.

FIG. 3(c) illustrates the hole 340 after application of an unbalanced etchant. In this example, a greater amount of the A layers 320.1, 320.2, . . . , 320.n are eroded than are eroded from the B layers 330.1, 330.2, . . . , 330.n.

FIG. 3(d) schematically illustrates the hole 340 having been filled with a dielectric material 350. FIG. 3(e) illustrates the hole 340 after the dielectric material 350 has been etched away. In this example, metal of the B layers 330.1, 330.2, . . . , 330.n are exposed within the holes. Metal of the A layers 320.1, 320.2, . . . , 320.n, however, may be covered with residual amounts of the dielectric material, shown as 350.1, 350.2, 352.1, 352.2, . . . , 354.1, 354.2.

FIG. 3(f) illustrates the hole 340 after it has been filled with a conductive material 360. In this example, the conductive material 360 engages the metal of the B layers 330.1, 330.2, . . . , 330.n, which completes electrical connectivity between the conductive post and those layers. The conductive material 360 is insulated from the A layers 320.1, 320.2, . . . , 320.n, however, by the dielectric material 350.1, 350.2, 352.1, 352.2, . . . , 354.1, 354.2 and the dielectric layers that separate the A layers from the B layers.

The example of FIG. 3 illustrates manufacturing operations for fabrication of a single conductive post in the stacked structure of FIG. 1. As discussed in FIG. 2, to form a second conductive post, the operations illustrated in FIG. 3 may be repeated to form a second hole (not shown). When a second unbalanced etchant is applied, the etchant may erode a greater amount of the B layers 330.1, 330.2, . . . , 330.n than the A layers 320.1, 320.2, . . . , 320.n. Similarly, when etching the dielectric material from the second hole, the etching should expose metal of the A layers 320.1, 320.2, . . . , 320.n within the hole. Metal of the B layers 330.1, 330.2, . . . , 330.n, however, may be covered with residual amounts of the dielectric material, which prevents the B layers from electrically connecting to the conductive post that is intended for the A layers.

Figure 4:
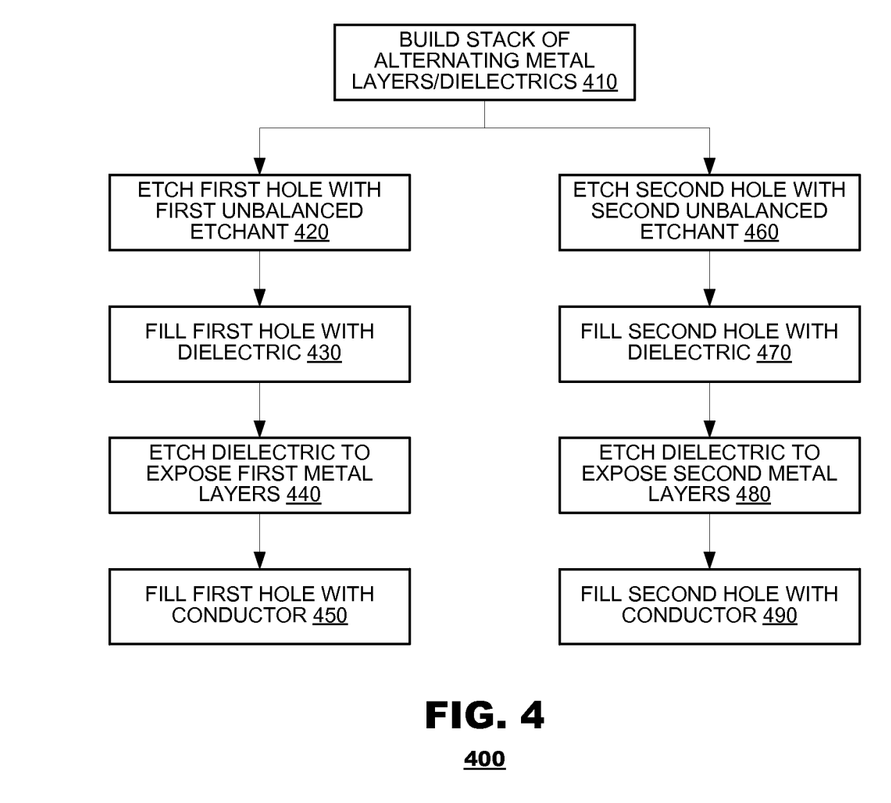
FIG. 4 illustrates another method of manufacturing a stacked structure according to an embodiment of the present invention.

FIG. 4 illustrates another method 400 of manufacturing a stacked structure according to an embodiment of the present invention. The method 400 may begin by building a stack of alternating metal layers separated by dielectrics (box 410). Again, the method 400 may build the entire set of A and B layers that will be used in the structure prior to developing the post conductors. After the stack is constructed, the method 400 may construct each conductive post separately from the other. To build a first conductive post, the method 400 may etch a first hole through the stacked structure using a first unbalanced etchant (box 420). The first unbalanced etchant may erode material from one of the metal layers (the A layer) faster than it erodes material from the second metal layer (the B layer). The method may fill the first hole with a dielectric material (box 430) then etch the dielectric material away from the holes to expose the metal layers on which the etchant acted less aggressively (box 440). Thereafter, the method 400 may fill the first hole with a conductor material to form the first conductor post (box 450).

To build the second conductive post, the method 400 may etch a second hole through the stacked structure using a second unbalanced etchant (box 460). The second unbalanced etchant may erode material from the second type of metal layers (the B layers) faster than it erodes material from the first type of metal layer (the A layers). The method 400 may fill the second hole with the dielectric material (box 470) then etch the dielectric material away from the second hole to expose the metal layers on which the etchant acted less aggressively (box 480). Thereafter, the method 400 may fill the second hole with a conductor material to form the second conductor post (box 490).

Operation of the method 400 of FIG. 4 also is expected to achieve a low cost method of manufacturing a stacked conductor structure such as in FIG. 1. Manufacture of the stacked A and B layers should be inexpensive because a single wafer fabrication machine may be used to build repetitive sets of an A layer, a dielectric, a B layer and another dielectric. Moreover, the process steps involved in manufacturing the conductive posts should require two sets of masks to etch a hole for a conductive post, fill the hole with a dielectric, etch away the dielectric to expose metal layers that should be connected to the conductive post, then fill the hole with conductive material to connect to the exposed metal layers. Such cost savings likely would not occur through use of alternative manufacturing processes that, for example, build portions of the conductive posts incrementally as the A and B layers are built up on top of each other.

Figure 5:
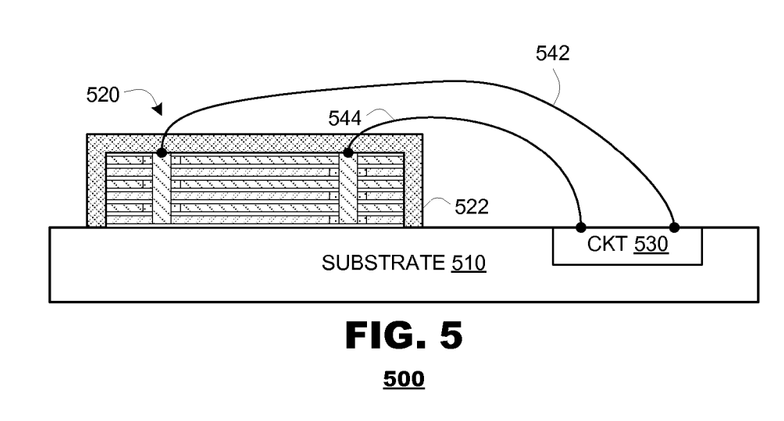
FIG. 5 illustrates application of the stacked conductor structure in a circuit system according to an embodiment of the present invention.

FIG. 5 illustrates application of the stacked conductor structure in a circuit system 500 according to an embodiment of the present invention. In FIG. 5, the system 500 may include a semiconductor substrate 510, a stacked conductor structure 520 and an integrated circuit 530. The stacked conductor structure 520 may be fabricated on top of the semiconductor substrate 510 using any of the processes described herein. The integrated circuit 530 may be fabricated on the semiconductor substrate 510 using traditional integrated circuit manufacturing techniques. Terminals of the integrated circuit 530 may be connected to conductor posts within the stacked conductor structure 520 via bonding wires 542, 544 or other conductive structures. Alternatively, the stacked structured may be flipped and connected to conductive structures that are formed on the substrate, avoiding the need for bonding wires.

And, in a further embodiment, the stacked conductor structures may be formed over interconnect conductors that are formed on the substrate and exposed when the holes initially are formed. When the conductor posts are formed within the holes, they may make direct electrical contact with the exposed interconnect without requiring other connection structures.

In another embodiment, rather than forming the stacked structure on a semiconductor substrate, other substrates may be used. For example, it may be convenient to form the stacked structure on a printed circuit board (PCB) or other materials as a substrate.

In this embodiment, the stacked conductor structure 520 may be provided as a multi-layer capacitor. It may be used in lieu of a discrete capacitor, which typically would be manufactured separately from the integrated circuit 530 and be electrically connected to the integrated circuit 530 after the integrated circuit 530 is fabricated. Using the principles of the present invention, fabrication of a stacked conductor structure 520 may occur contemporaneously with fabrication of the integrated circuit 530 and may lower overall manufacturing costs of circuit system 500.

In another embodiment, the stacked conductor structure 520 may be provided in a package housing 522 such as a plastic housing or encapsulant.

Figure 6:
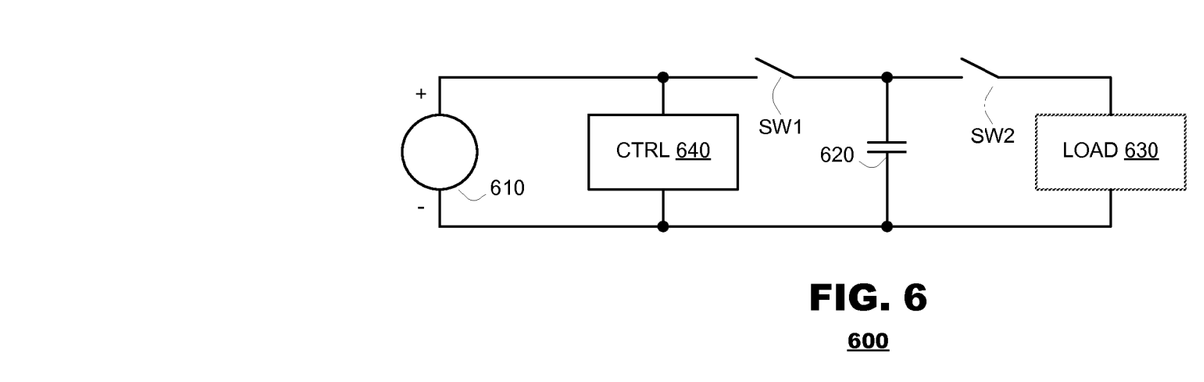
FIG. 6 illustrates an application of a stacked conductor structure according to another embodiment of the present invention.

FIG. 6 illustrates an application of the stacked conductor structure according to another embodiment of the present invention. There, a system 600 may include a power source 610, a storage capacitor 620 and a load device 630. The stacked conductor structure of the foregoing embodiments may be used as the storage capacitor 620 in the system 600.

The storage capacitor 620 may be employed in environments where a local power source 610 provides only intermittent or low level voltages. Common examples may be where a power source 610 is provided as a solar cell or a thermal harvester. See, for example, published application 2014/0246066 for an example of a thermal harvester. Energy from the power source 610 may be accumulated in the storage capacitor 620 for delivery to a load device 630. The load device may include communication equipment such as a wireline or a wireless (Bluetooth, RFID) communicator. The system 620 also may possess a local controller 640 (for example, a microcontroller) to perform switching, via switches SW1 and SW2, among the power source 610, capacitor 620 and load device 630 to govern charging of the capacitor 620 and delivery of power from the capacitor 620 to the load device.

Several embodiments of the invention are specifically illustrated and/or described herein. However, it will be appreciated that modifications and variations of the invention are covered by the above teachings and within the purview of the appended claims without departing from the spirit and intended scope of the invention. Further variations are permissible that are consistent with the principles described above.

What is claimed is:

1. A circuit structure, comprising:
a plurality of stacked conductor layers separated from each other by respective dielectric layers made of a first type of dielectric material, the plurality of stacked conductor layers including a first set of conductor layers made of a first type of conductor material and a second set of conductor layers made of a second type of conductor material different from the first type of conductor material, and
a conductor post electrically connected to the first set of conductor layers and electrically insulated from the second set of conductor layers by a set of insulating layers in-plane with the second set of conductor layers and made of a second type of dielectric material different than the first type of dielectric material.

2. The circuit structure of claim 1, wherein the conductor post is a first conductor post, and wherein the circuit structure further comprises a second conductor post electrically connected to the second set of conductor layers and electrically insulated from the first set of conductor layers, wherein the first and second conductor posts are provided in first and second holes, respectively, formed in the stacked conductor layers, the first hole defining an aperture for the first conductor post in which the second set of conductor layers are etched away in larger amount than the first set of conductor layers and the second hole defining an aperture for the second conductor post in which the first set of conductor layers are etched away in a larger amount than the second set of conductor layers.

3. The circuit structure of claim 1, wherein the layers of the first set of conductor layers and the layers of the second set of conductor layers overlay each other in an alternating pattern across the stack.

4. The circuit structure of claim 1, wherein the circuit structure forms a multi-layer capacitor.

5. The circuit structure of claim 1, wherein the circuit structure is a distribution system for supply voltages of an electrical circuit.

6. The circuit structure of claim 1, further comprising a semiconductor substrate, wherein the circuit structure forms an electromagnetic shield and has a cavity defined therein for provision of an integrated circuit.

7. The circuit structure of claim 1, wherein the stacked conductor layers are disposed on a semiconductor substrate.

8. The circuit structure of claim 7, further comprising an integrated circuit fabricated within the substrate and electrically connected to the circuit structure.

9. A circuit structure, comprising:
a first set of stacked conductor layers and a second set of stacked conductor layers, wherein the first and second sets of stacked conductor layers are separated from each other by a set of dielectric layers made of a first type of dielectric material; and
a conductor post traversing the first and second sets of stacked conductor layers, the conductor post in electrical contact with the first set of stacked conductor layers and insulated from the second set of stacked conductor layers by a set of insulating layers of a second type of dielectric material different from the first type of dielectric material.

10. The circuit structure of claim 9, wherein the first set of stacked conductor layers is made of a first conducting material, and wherein the second set of stacked conductor layers is made of a second conducting material different than the first conducting material.

11. The circuit structure of claim 10, wherein the layers of the first conducting material and the layers of the second conducting material overlay each other in an alternating pattern.

12. The circuit structure of claim 9, wherein the circuit structure forms a multi-layer capacitor.

13. The circuit structure of claim 1, wherein the first set of conductor layers and the second set of conductor layers have outer edges substantially aligned with each other.

14. The circuit structure of claim 9, further comprising a semiconductor substrate, wherein the circuit structure forms an electromagnetic shield and has a cavity defined therein for provision of an integrated circuit.

15. The circuit structure of claim 9, wherein the stacked conductor layers of the first set are disposed on a semiconductor substrate.

16. The circuit structure of claim 15, further comprising an integrated circuit fabricated within the substrate and electrically connected to the circuit structure.

17. The circuit structure of claim 9, wherein a material of the first conductor post is the same as a material of the first set of stacked conductor layers.

18. The circuit structure of claim 9, wherein the conductor post is a first conductor, and wherein the circuit structure further comprises a second conductor post electrically connected to the second set of stacked conductor layers, wherein a material of the second conductor post is the same as a material of the second set of conductor layers.

19. A circuit structure comprising:
a plurality of stacked conductor layers separated from each other by respective dielectric layers, the plurality of stacked conductor layers including a first conductor layer made of a first type of conductor material and a second conductor layer adjacent the first conductor layer and made of a second type of conductor material different from the first type of conductor material, and
a conductor post electrically connected to the first conductor layer and electrically insulated from the second conductor layer,
wherein a periphery of the first conductor layer aligns with a periphery of the second conductor layer, and
wherein the conductor post is electrically insulated from the second conductor layer by an insulating layer of a material different than the respective dielectric layers.

20. The circuit structure of claim 19, wherein the plurality of stacked conductor layers are disposed on a semiconductor substrate.

* * * * *